US012014910B2

(12) United States Patent
Cheng et al.

(10) Patent No.: US 12,014,910 B2
(45) Date of Patent: Jun. 18, 2024

(54) METHOD AND SYSTEM FOR ADJUSTING LOCATION OF A WAFER AND A TOP PLATE IN A THIN-FILM DEPOSITION PROCESS

(71) Applicant: Taiwan Semiconductor Manufacturing Co., Ltd., Hsinchu (TW)

(72) Inventors: Yu-Hsiang Cheng, Hsinchu (TW); Che-Wei Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/494,553

(22) Filed: Oct. 5, 2021

(65) Prior Publication Data

US 2023/0105279 A1   Apr. 6, 2023

Related U.S. Application Data

(60) Provisional application No. 63/163,192, filed on Mar. 19, 2021.

(51) Int. Cl.
*C23C 16/52*   (2006.01)
*H01J 37/32*   (2006.01)

(52) U.S. Cl.
CPC ........ *H01J 37/32926* (2013.01); *C23C 16/52* (2013.01); *H01J 37/32733* (2013.01); *H01J 37/32981* (2013.01); *H01J 2237/3321* (2013.01)

(58) Field of Classification Search
CPC .......... H01J 37/32926; H01J 37/32733; H01J 37/32981; H01J 2237/3321; C23C 16/52
See application file for complete search history.

(56) References Cited

U.S. PATENT DOCUMENTS

| 10,699,937 B2 | 6/2020 | Konkola et al. |
| 2010/0132890 A1 | 6/2010 | Mizukami et al. |
| 2013/0323860 A1* | 12/2013 | Antolik ................... H01L 21/67 |
| | | 156/345.34 |
| 2016/0181130 A1 | 6/2016 | Singh et al. |
| 2017/0002465 A1* | 1/2017 | Shaikh .............. H01J 37/32082 |

(Continued)

FOREIGN PATENT DOCUMENTS

| CN | 101437981 A | 5/2009 |
| CN | 100582291 C | 1/2010 |

(Continued)

*Primary Examiner* — Dah-Wei D. Yuan
*Assistant Examiner* — Nga Leung V Law
(74) *Attorney, Agent, or Firm* — Seed IP Law Group LLP

(57) ABSTRACT

A thin-film deposition system includes a top plate positioned above a wafer and configured to generate a plasma during a thin-film deposition process. The system includes a sensor configured to generate sensor signals indicative of a lifetime of a component of the thin-film deposition system, a characteristic of a thin-film deposited by the thin-film deposition system or a characteristic of a process material that flows into the thin-film deposition system. The system includes a control system configured to adjust a relative location of a top plate of the thin-film deposition system with respect to a location of a wafer in the thin-film deposition system during the thin-film deposition process responsive to the sensor signals.

20 Claims, 6 Drawing Sheets

(56) References Cited

U.S. PATENT DOCUMENTS

2021/0395885 A1* 12/2021 Chen .................. H01J 37/32935
2022/0344184 A1* 10/2022 Sadeghi ............ H01L 21/67184

FOREIGN PATENT DOCUMENTS

| CN | 102373434 A | 3/2012 |
| CN | 103160805 A | 6/2013 |
| CN | 104894524 A | 9/2015 |
| TW | 201930640 A | 8/2019 |
| TW | 201937633 A | 9/2019 |

* cited by examiner

METHOD AND SYSTEM FOR ADJUSTING LOCATION OF A WAFER AND A TOP PLATE IN A THIN-FILM DEPOSITION PROCESS

BACKGROUND

Technical Field

The present disclosure relates to the field of semiconductor processing. The present disclosure relates more particularly to thin-film deposition processes.

Description of the Related Art

Fabrication of integrated circuits is typically accomplished by performing a large number of processing steps on semiconductor wafers. The processing steps typically result in the formation of a large number of transistors in highly complex arrangements in conjunction with a semiconductor substrate. The processing steps also result in the formation of dielectric layers, metal interconnects, vias, plugs, and other integrated circuit structures and components.

For optimum device performance and production yield, thin-films deposited during thin-film deposition processes preferably exhibit uniform characteristics. When deposited thin-films do not exhibit uniform characteristics, out of compliance devices are produced which may need to be discarded. In addition, time must be spent to adjust the process so that the number of out of compliance devices produced is minimized.

DETAILED DESCRIPTION

Figure 1:
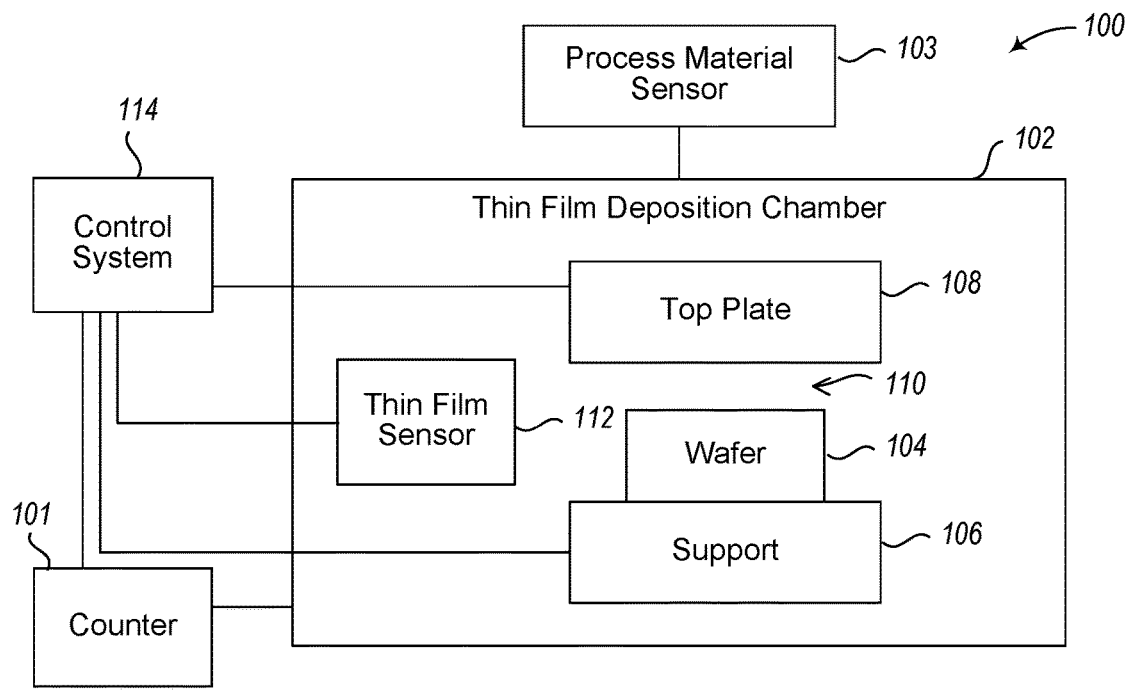
FIG. 1 is a block diagram of a thin-film deposition system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may just distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a thin-film deposition system with improved performance. A thin-film deposition system includes a top plate positioned above a semiconductor substrate, e.g., a wafer, held by an electrostatic chuck or a wafer table or pedestal. Embodiments of the present disclosure monitor the relative location of the top plate with respect to the wafer and automatically adjust the location of the top plate or the location of the wafer or both in situ during a deposition process. This provides for steady deposition rates which results in deposited thin-films of uniform characteristics from wafer to wafer and from batch to batch. The result is that fewer wafers are scrapped, down time for periodic maintenance is reduced, down time for adjustment of the equipment is reduced and thin-films are properly formed.

FIG. 1 is a block diagram of a thin-film deposition system 100, according to one embodiment. The thin-film deposition system 100 includes a thin-film deposition chamber 102. During thin-film deposition processes, a wafer 104 is supported within the thin-film deposition chamber 102 by a wafer support plate 106. A process material is provided to the thin-film deposition chamber 102. In a plasma enhanced deposition process, a plasma is generated in the thin-film deposition chamber 102. The thin-film deposition system 100 deposits a thin-film on the wafer 104 during the thin-film deposition process.

The thin-film deposition system 100 includes a top plate 108 positioned above the wafer 104. The top plate 108 can assist in the thin-film deposition process. For example, the top plate 108 can assist in generating a voltage or electric field within the thin-film deposition chamber 102. The voltage or electric field can facilitate deposition of a selected type of thin-film on the wafer 104.

The wafer 104 is separated from the top plate 108 by a gap 110. The gap 110, i.e., the distance between the top surface of the wafer 104 and the bottom surface of the top plate 108 can have an effect on the thin-film deposition process. If the gap is too large or too small, then a thin-film may not be properly deposited or may have an undesired deposition rate whether that be too low or too high. When a thin-film is not properly deposited, the deposited thin-film on a wafer may not have uniform properties and/or the deposited thin-film may not have uniform properties from wafer to wafer.

In accordance with some embodiments of the present disclosure, the thin-film deposition system 100 includes a thin-film sensor 112. The thin-film sensor 112 is configured to generate sensor signals based on characteristics of a thin-film on the wafer 104. In accordance with other embodiments, thin-film sensor 112 detects characteristics of a thin-film deposited on surfaces of a deposition chamber 102 of the thin-film deposition system 100. Such thin-film thickness can be sensed during processing of a single batch of wafers or can be collected for runs of different batches of wafers or for different runs of a portion of a single batch of wafers. Sensor signals from thin-film sensor 112 can also be indicative of a zone on the wafer surface from which the characteristics have been detected. Examples of different zones 1-4 are described below. The sensor signals are indicative of characteristics of the thin-film on the wafer 104. For example, the sensor signals are indicative of one or more of a thickness of the thin-film, film composition, film crystal structure, a hardness of the thin-film, thermal stability of the thin-film, surface roughness of the thin-film, band gap of the thin-film or residual stresses in the thin-film. Sensors capable of generating sensor signals indicative of these thin-film properties are known and are not described in more detail herein. Thin-film sensors in accordance with embodiments of the present disclosure are not limited to sensors capable of generating the sensor signals described above. In other embodiments, thin-film sensor 112 can be a sensor capable of generating sensor signals indicative of characteristics of the thin-film other than those described above. As described below in more detail, such sensor signals are utilized to determine a position where top plate 108 should be located, to determine a position where wafer 104 should be located, or both.

The thin-film deposition system also includes a gap sensor 113. The gap sensor 113 is configured to generate sensor signals based on the gap 110, e.g., the size of the gap 110.

The sensor signals from the gap sensor 113 can indicate the magnitude of the gap 110 or the relative size of the gap 110. In any case, the sensor signals from gap sensor 113 can be utilized to determine whether or not the size of gap 110 should be adjusted.

Figure 2:
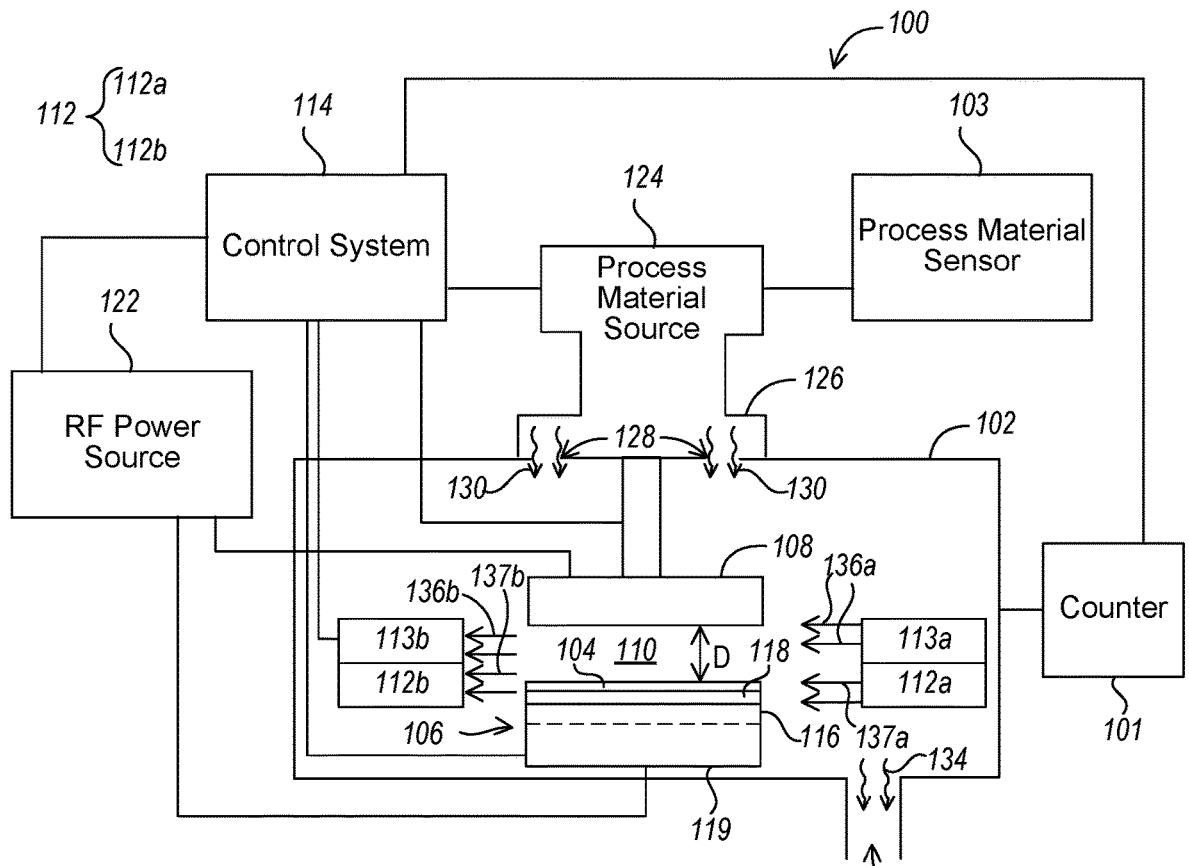
FIG. 2 is an illustration of a thin-film deposition system, according to one embodiment.

In one embodiment illustrated in FIG. 2, the gap sensor 113 can include a radiation emitter 113a that emits electromagnetic radiation 136a into the gap 110. The gap sensor 113 can also include a radiation sensor 113b that senses the radiation 136b emitted exiting through the gap 110. The amount of radiation sensed by the radiation sensor 113b of the gap sensor 113 can be indicative of the size of the gap 110. The radiation sensor 113b can provide sensor signals indicative of the size of the gap 110. The radiation emitter 113a can emit electromagnetic radiation in the visible spectrum, the infrared spectrum, the ultraviolet spectrum, or another spectrum. The radiation emitter 113a can emit radiation in a laser beam or in another manner.

In one embodiment, the gap sensor 113 includes an image capture device that captures an image of the gap 110. The image capture device can capture visible light images, infrared images, ultraviolet light images, or other types of images. The size of the gap 110 can be measured from the captured image. Various other types of gap sensors 113 can be utilized without departing from the scope of the present disclosure.

In FIGS. 1 and 2, the gap sensor 113 is illustrated as being positioned within the thin-film deposition chamber 102. However, the gap sensor 113 may be positioned external to the thin-film deposition chamber 102 in some embodiments. For example, the gap sensor 113 may sense parameters associated with the gap 110 through one or more apertures or windows in a wall of the thin-film deposition chamber 102. Various positions of the gap sensor 113 can be utilized without departing from the scope of the present disclosure.

In one embodiment, the thin-film sensor 112 can include an ellipsometer, x-ray photoelectron spectrometer (XPS), ultra-sound sensor, x-ray fluorescence (XRF) spectrometer, optical emission spectrometer, interferometric sensor. Such devices typically include an emitter 112a that emits signals 137a that interrogate the thin-film on the wafer 104 to determine characteristics of the thin-film on the wafer 104. The thin-film sensor 112 can also include a receiver 112b that senses a signal 137b from the thin-film. The signal 137b received by receiver 112b of the thin-film sensor 112 can be indicative of the characteristics, described above, of the thin-film. The receiver 112b can provide sensor signals indicative of such characteristics.

In one embodiment, the thin-film sensor 112 includes an image capture device that captures an image of the surface of the deposited thin-film. The image capture device can capture visible light images, infrared images, ultraviolet light images, or other types of images. Some characteristics of the thin-film can be evaluated from the captured image. Various other types of thin-film sensors 112 can be utilized without departing from the scope of the present disclosure.

In FIGS. 1 and 2, the thin-film sensor 112 and its emitter 112a and receiver 112b are illustrated as being positioned within the thin-film deposition chamber 102 at particular locations. However, the emitter 112a and receiver 112b may be positioned at different locations or different angles within the thin-film deposition chamber 102. In addition, one or more of the emitter 112a and receiver 112b may be located external to the thin-film deposition chamber 102 in some embodiments. For example, the emitter 112a or receiver 112b or both may sense parameters associated with the thin-film through one or more apertures or windows in a wall of the thin-film deposition chamber 102. Various positions of the emitter 112a and receiver 112b can be utilized without departing from the scope of the present disclosure.

In the embodiment illustrated in FIGS. 1 and 2, the thin-film deposition system 100 includes a control system 114. The control system 114 is coupled to the thin-film sensor 112, to the gap sensor 113, to the top plate 108 and to the wafer support 106. The control system 114 receives the sensor signals from the thin-film sensor 112 and the gap sensor 113. The control system 114 can determine whether or not the location of the top plate 108, the wafer 104 or both should be adjusted based on the sensor signals from the thin-film sensor 112 and the gap sensor 113. The control system 114 can adjust the relative location of the top plate 108 with respect to the location of the wafer 104 by raising or lowering the top plate 108 relative to the wafer 104. Alternatively, the control system 114 can adjust the relative location of the top plate 108 with respect to the location of the wafer 104 by raising or lowering the wafer support 106 relative to the top plate 108. In other embodiments, the relative location of the top plate 108 with respect to the location of the wafer 104 can be adjusted by moving the top plate 108 in a lateral direction perpendicular to the direction that the top plate 108 or the wafer support 106 are raised or lowered. In other embodiments, the relative location of the top plate 108 with respect to the location of the wafer 104 can be adjusted by moving the wafer support 106 in a lateral direction perpendicular to the direction that the top plate 108 or the wafer support 106 are raised or lowered.

In one embodiment, the control system 114 receives analog sensor signals from the thin-film sensor 112 and the gap sensor 113. The control system 114 can convert the analog sensor signals to digital form by performing an analog-to-digital conversion. The control system 114 can then analyze the digitized sensor signals to determine the characteristic of the thin-film and the absolute or relative magnitude of the gap 110. In one example, the control system 114 can compare the digitized sensor signals to reference sensor signals stored in one or more memories associated with the control system 114. The control system 114 can then adjust the relative location of the top plate 108 with respect to the wafer 104, for example, by controlling a motor that raises or lowers the top plate 108, controlling a motor that raises or lowers the wafer support 106, controlling a motor that moves the top plate 108 laterally or controlling a motor that moves the wafer support 106 laterally.

In one embodiment, the control system 114 receives digital sensor signals from the thin-film sensor 112 and the gap sensor 113. The control system 114 can process and analyze the digital sensor signals received from the thin-film sensor 112 and the gap sensor 113. The control system 114 can then determine the characteristic of the thin-film and the magnitude of the gap 110 and determine whether or not the relative location of the top plate 108 with respect to the wafer 104 should be adjusted based on analysis of the sensor signals.

In the embodiment illustrated in FIGS. 1 and 2, the thin-film deposition system 100 includes sensors in addition to or as alternatives to thin-film sensor 112. For example, thin-film deposition system 100 includes a counter 101 that keeps track of and determines the number of wafers that have been processed in thin-film deposition chamber 102 and generates a sensor signal indicative of the number of wafers processed. The sensor signal from counter 101 indicating the number of wafers that have been processed in thin-film deposition chamber 102 is representative of the lifetime of a component of the thin-film deposition system. In other words, counter 101 is an example of a sensor that is capable of generating sensor signals indicative of a lifetime of a component of the thin-film deposition system. For example, the sensor signal from counter 101 can indicate the lifetime of the showerhead (e.g., how long the showerhead has been operated since the last inspection, periodic maintenance or replacement), a heater, an electrostatic chuck, radiofrequency generator, processing chamber or other components of the thin-film deposition system 100. Monitoring the number of wafers that have been processed will also provide an indication of the length of time a chamber has been carrying out a process, i.e., chamber process time. Alternatively, the lifetime of components of the thin-film deposition system can be monitored using a sensor other than a counter. For example, a timer that clocks running time and down time of the thin-film deposition system is another example of a sensor that is capable of generating sensor signals indicative of a lifetime of a component of a thin-film deposition system. For example, a timer can be used to monitor the number of hours the radiofrequency generator is operated. Such timer can also be used to monitor the length of time a chamber has been running a process. A sensor capable of generating sensor signals indicative of a lifetime of a component of a thin-film deposition system are not limited to the counter or the timer described above. A sensor capable of generating sensor signals indicative of a lifetime of a component of a thin-film deposition system in accordance with embodiments of the present disclosure includes sensors other than a counter or a timer described above.

In the illustrated embodiment of FIG. 2, thin-film deposition system 100 also includes a process material sensor 103 that is capable of generating sensor signals reflecting a characteristic of a process material that flows into the thin-film deposition chamber 102. Process material characteristics reflected by sensor signals generated by process material sensor 103 include composition of the process gas, flow rate of the process gas, temperature of the process gas and pressure of the process gas. Sensors capable of generating sensor signals indicative of a composition of a process gas, flow rate of a process gas, pressure of a process gas or temperature of a process gas are known and are not described in more detail herein. Process material sensor 103 is not limited to detecting the foregoing characteristics of a process gas. Process gas sensors which are able to detect other characteristics of the process gas are within the scope of the present disclosure.

In the embodiment illustrated in FIGS. 1 and 2, the thin-film deposition system 100 is illustrated as including thin-film sensor 112, counter 101 and process material sensor 103; however, embodiments in accordance with the present disclosure are not limited to thin-film deposition systems 100 that include all three of these sensors. In other embodiments, thin-film deposition system 100 includes fewer than all three of these sensors. In addition, in other embodiments, the thin-film deposition system 100 includes sensors other than or in addition to the thin-film sensor 112, counter 101 and process material sensor 103. For example, thin-film deposition system 100 can include a sensor capable of generating a sensor signal indicative of a tilt angle of the wafer on support 106. Sensors capable of generating a sensor signal indicative of a tilt angle of the wafer on support 106 are known and are not described in more detail herein.

FIG. 2 is an illustration of a thin-film deposition system 100, according to one embodiment. The thin-film deposition system 100 includes a thin-film deposition chamber 102.

The thin-film deposition chamber 102 includes a wafer 104 supported on a wafer support 106. The thin-film deposition system 100 deposits a thin-film on the surface of the wafer 104 during a thin-film deposition process.

In the example FIG. 2, the thin-film deposition system 100 is a plasma enhanced chemical vapor deposition (PECVD) system. The plasma enhanced chemical vapor deposition system can be utilized to deposit dielectric layers on the wafer 104. The dielectric layers can include silicon oxides, silicon nitride, or other types of dielectric layers. The thin-film deposition system 100 can be utilized to deposit other types of layers or to perform other types of semiconductor processes than those described above without departing from the scope of the present disclosure.

The wafer support 106 supports a wafer 104. The wafer support 106 can include a heater 116 or can function as a heater to heat the wafer 104 during the thin-film deposition process. Heating the wafer 104 can facilitate deposition of a thin-film on the surface of the wafer 104. The heater 116 can include one or more heating coils that generate thermal energy that is transferred to the wafer 104. Alternatively, the heater 116 can include other types of heating elements for generating thermal energy and heating the wafer 104. In some embodiments, support 106 includes cooling elements for removing thermal energy from the wafer 104. Further details regarding the heating function of the wafer support 106 will be described in further detail below.

The wafer support 106 can also include a bottom plate 118. The bottom plate 118 can be a bottom electrode to facilitate the generation of plasma within the thin-film deposition chamber 102 as will be described in more detail below. In one embodiment, the wafer 104 rests directly on the bottom plate 118. In other embodiments, the wafer 104 rests on pins that are attached to the bottom plate 118. The bottom plate 118 can include a conductive material such as a metal or conductive ceramic. In one embodiment, the heater 116 and the bottom plate 118 can be integrated together. In an embodiment, the underside of support 106 is connected to a pedestal which includes a mechanism for raising, lowering or moving laterally the wafer support 106. When the pedestal 119 is raised, the wafer 104 is brought into closer proximity to top plate 108. When the pedestal 119 is lowered, the proximity of the wafer 104 relative to the top plate 108 is increased. When the pedestal is moved laterally, the lateral position of the wafer 104 relative to the top plate 108 is changed.

The thin-film deposition system 100 includes a top plate 108 and a radiofrequency power source 122. The top plate 108 acts as a top electrode for generating a plasma during a thin-film deposition process. The top plate 108 can include a conductive material such as a metal or conductive ceramic material.

During a thin-film deposition process, the radiofrequency power source 122 provides a radiofrequency voltage between the bottom plate 118 and the top plate 108. The electrical connections between the radiofrequency power source 122 and the bottom and top plates 118 and 108 are not shown in FIG. 2. The radiofrequency power source 122 is also coupled to the control system 114. The control system 114 can control the function of the radiofrequency power source 122. During a thin-film deposition process, the control system 114 can cause the radiofrequency power source 122 to apply the radiofrequency voltage between the top plate 108 and the bottom plate 118.

The thin-film deposition system 100 includes a process material source 124 and a manifold 126. The process material may be a gas which includes a material to be deposited as the thin-film. During the thin-film deposition process, the process material source 124 supplies deposition gases 130 into the thin-film deposition chamber 104 via the manifold 126. The thin-film deposition chamber 102 can include apertures 128 that enable the flow of deposition gases 130 into the thin-film deposition chamber 102 from the gas source 124. The flow of the thin-film deposition gases 130 into the thin-film deposition chamber 102, in combination with other factors, results in the deposition of a thin-film on the top surface of the wafer 104. The thin-film deposition system 100 includes an exhaust channel 132 by which exhaust fluids 134 are evacuated from the thin-film deposition chamber 102.

In one embodiment, the thin-film deposition system 100 includes a top lid. The top lid can include the apertures 128 through which deposition gases 130 flow into the thin-film deposition chamber 102 during thin-film deposition processes.

Thin-film deposition system 100 illustrated in FIG. 2 also includes a process material sensor 103 for generating sensor signals indicative of characteristics of the process material delivered from process material source 124 to thin-film deposition chamber 102 as described above with reference to FIG. 1. Thin-film deposition system 100 illustrated in FIG. 2 also includes a counter 101 described above with reference to FIG. 1.

In the example of FIG. 2, the top plate 108 is shown as being separate from the components that flow deposition gases 130 into the thin-film deposition chamber 102. However, in one embodiment, the top plate 108 can be a showerhead type top electrode that includes a plurality of apertures in fluid communication with the gas source 124. In this case, deposition gases 130 are output from the gas source 124 through the apertures in the top plate 108 into the thin-film deposition chamber 102. Other types of systems and components can be utilized for flowing deposition gases 130 into the thin-film deposition chamber 102 without departing from the scope of the present disclosure. The apertures of showerhead type top electrodes have a tendency to become smaller as more and more wafers are processed through the thin-film deposition system. The apertures tend to become smaller because process materials are deposited on the surface of the showerhead and/or within the apertures within the showerhead. Accordingly, periodic maintenance must be performed on the showerhead in order to clean the surface of the showerhead and remove material that has caused the apertures of the showerhead to become smaller. Between such periodic maintenance, the reduction in the size of the smaller apertures in the showerhead must be compensated for by increasing the flow rate of the process materials.

During a PECVD process, deposition gases 130 are passed from the gas source 124 into the interior volume of the thin-film deposition chamber 102. The radiofrequency power source 122 generates a plasma from the deposition gases within the interior volume by applying a voltage between the bottom plate 118 and the top plate 108. In particular, the plasma is generated between the top surface of the wafer 104 and the bottom surface of the top plate 108. The plasma enhances deposition of a thin-film on the wafer 104. Embodiments in accordance with the present disclosure are not limited to a plasma enhanced CVD processes. For example, embodiments in accordance with the present disclosure are useful with CVD processes that are not plasma enhanced.

In one example, the radiofrequency power source 122 applies an AC voltage signal having a frequency between 5

MHz and 15 MHz. In one example, the radiofrequency power source 122 applies the radiofrequency voltage of the magnitude between 100 V and 500 V. Other frequencies and voltages can be utilized without departing from the scope of the present disclosure. Furthermore in some examples, the plasma may be generated by application of a DC voltage. In some examples, the bottom plate 118 is not present and the plasma is generated primarily by applying a voltage to the top plate 108.

PECVD processes follow particular recipes based on the particulars of the PECVD system, the thin-film to be deposited, and other factors. One factor in the PECVD recipe is the distance D between the top surface of the wafer 104 and the bottom surface of the top plate 108. The distance D corresponds to the magnitude of the gap 110. Accordingly, the gap 110 corresponds to the distance D between the top surface of the wafer 104 and the bottom surface of the top plate 108. If the magnitude of the gap 110 is outside of a selected range, then the thin-film deposition process may not be performed properly. As will be set forth in more detail below, insufficient uniformity in the deposited thin-film, including insufficient uniformity with respect to thickness of the thin-film, composition of the thin-film or other characteristics of the thin-film are all possible results of the gap 110 being outside a selected range in accordance with the recipe of the particular PECVD process. Accordingly, the thin-film deposition process is sensitive to the magnitude of the gap 110.

For some PECVD processes or systems, the desired gap 110 may be somewhere between 5 mm and 20 mm. In other cases, the desired gap 110 may be significantly smaller. For example, in one embodiment, the PECVD thin-film deposition system 100 calls for a gap 110 somewhere between 0.2 mm and 0.7 mm based on the particular process and other factors. The actual tolerance range may be less than 0.1 mm. For example, the PECVD system may call for a gap 110 of 0.5 mm, with a tolerance range of ±0.1 mm outside of this value. In other words, the recipe may call for a gap 110 between 0.4 and 0.6 mm.

While performing a PECVD process on the wafer 104, it is possible that thin-films that are not uniform in properties are formed on the wafer 104. This lack of uniformity can be a result of the gap 110 not being within the specifications of the PECVD process. In the past, when such lack of uniformity was detected, the thin-film deposition system 100 had to be shut down so that the position of the bottom surface of top plate 108, the top surface of the wafer 104, or both could be adjusted to bring the distance D back within the process specifications. After such adjustment and restart, the uniformity of the deposited thin-films would be monitored and checked for compliance. If the adjustments did not result in the deposition of thin-films that were within the required uniformity specifications, the system needed to be shut down again and further adjustments made. Shutting down the thin-film deposition system 100 results in an undesirable reduction in production rates, which increases per wafer costs. The thin-film deposition process can be adversely affected by the gap 110 being outside of the desired range in ways other than the uniformity of the deposited thin-film. For example, the deposition rate, i.e., how quickly the thin-film builds up during the thin-film deposition process, can be affected by the magnitude of the gap 110. If the gap 110 is too wide, then the deposition rate may slow. If deposition rates slow down, then the thin-films may not be properly deposited. For example, if a layer of silicon dioxide is intended to have a final thickness of 20 nm, then the duration of the thin-film deposition process may need to be carefully timed based on the expected deposition rate. If the deposition rate is slower than expected, then the thin-film may not be as thick as expected. This can cause poor function, or complete malfunction, of integrated circuits that result from the wafer 104. Furthermore, it is possible that the thin-film will not have the intended composition if the gap 110 is not within the selected range.

There are various factors that can cause undesired fluctuations in the gap 110 during the thin-film deposition processes. For example, as described previously, the heater 116 heats the wafer 104 during the thin-film deposition process. Heating of the wafer 104 may also result in some heating of the top plate 108 due to heat transfer between the wafer 104 and the top plate 108. The top plate 108 will undergo thermal expansion as the top plate 108 is heated. The higher the temperature, the greater the thermal expansion will be. When the gap 110 is already intended to be somewhat small, even a small expansion of the top plate 108 can cause the gap 110 to narrow beyond the intended range. In one example, the heater 116 heats the wafer 104 to about 450° C. Depending on deposition conditions, the temperature of the top plate 108 may correspondingly increase to an unknown degree, causing an unknown amount of thermal expansion and a resultant unknown change in the size of gap 110.

Another factor that can result in different gap sizes is differing thicknesses of the wafer 104. For example, some wafers have a thickness of about 770 μm. Other wafers have a thickness of about 720 μm. When the size of the gap 110 is already small, this 50 μm difference in wafer thicknesses can result in very different thin-film deposition rates. Accordingly, if the thickness of the wafer 104 is either unknown, unaccounted for, or erroneously accounted for, then the gap 110 can have a magnitude that is outside the desired range.

The thin-film deposition system 100 includes a gap sensor 113 in the form of a through beam sensor. The through beam sensor includes a radiation emitter 113a and a radiation sensor 113b. The radiation emitter 113a emits radiation 136a through the gap 110 between the wafer 104 and the top plate 108. The radiation sensor 113b is positioned on an opposite side of the wafer 104 and top plate 108 from the radiation emitter 113a. The radiation sensor 113b is aligned to receive the radiation 136b after the radiation 136a has passed through the gap 110. The amount of radiation 136b received by the radiation sensor 113b is indicative of the size of the gap 110.

In one example, the radiation emitter 113a emits a beam of radiation 136a. Though not illustrated to scale in FIG. 2, the diameter of the beam is greater than the intended magnitude of the gap 110. Accordingly, a portion of the beam of radiation 136a is blocked by the side of the top plate 108 and the sides of the wafer 104, the bottom plate 118, and the heater 116. If the gap 110 is wider, less of the beam will be blocked and a correspondingly greater portion of the beam of radiation 136a will be received by the radiation sensor 113b. If the gap 110 is narrower, more of the beam will be blocked and a correspondingly smaller portion 136b of the beam of radiation 136a will be received by the radiation sensor 113b. Accordingly, the amount of radiation 136b received by the radiation sensor 113b is indicative of the size of the gap 110.

In one embodiment, the radiation sensor 113b generates a voltage based on the amount of radiation 136b received by the radiation sensor 113b. In one example, the radiation sensor 113b generates a voltage between 3.4 V and 3.8 V depending on the size of the gap 110. The higher the voltage, the greater the gap 110 will be.

The radiation sensor 113b outputs sensor signals to the control system 114. The sensor signals can be analog signals or digital signals. The sensor signals can include the voltage generated by the radiation sensor 113b from the received radiation 136b. The sensor signals can include analog or digital representations of the voltage generated by the radiation sensor 113b from the received radiation 136b. The sensor signals can indicate the absolute magnitude of the gap 110 or relative magnitude of the gap 110.

In one embodiment, the radiation emitter 113a emits an infrared laser beam. The laser beam can have a diameter of between 0.75 cm and 1.5 cm. The diameter of the laser beam can be selected so that under normal operating conditions the gap 110 does not exceed the diameter of the laser beam. The radiation emitter 113a can emit a laser beam in the ultraviolet or visible spectrum.

A specific example of a gap sensor 113 is provided in relation to FIG. 2. However, many other kinds of gap sensors 113 can be implemented without departing from the scope of the present disclosure. For example, a gap sensor 113 can include an array of image capture devices that capture images of the gap 110 and output images or other signals indicative of the size of the gap 110. Many other kinds of gap sensors can be utilized without departing from the scope of the present disclosure.

In addition to receiving sensor signals from gap sensor 113, the control system 114 receives the sensor signals from one or more of the counter 101, process material sensor 103 and thin-film sensor 112. The control system 114 analyzes the sensor signals from gap sensor 113 and analyzes sensor signals from one or more of the counter 101, process material sensor 103 and thin-film sensor 112 and determines whether or not the gap 110 should be adjusted. If the control system 114 determines that the gap 110 should be adjusted based on the sensor signals, the control system 114 can control a motor coupled to the top plate 108, or coupled to a mechanism that suspends the top plate 108. The control system 114 can cause the motor to raise or lower the top plate 108 relative to the wafer 104 in order to adjust the gap 110. Raising the top plate 108 relative to the wafer 104 increases the gap 110. Lowering the top plate 108 relative to the wafer 104 reduces the gap 110. Alternatively, the control system 114 can control a motor coupled to the pedestal 119 that supports heater 116, bottom plate 118 and wafer 104 and cause the motor to raise or lower the pedestal 119 relative to the wafer 104 in order to adjust the gap 110. Raising the pedestal 119 relative to the top plate 108 decreases the size of gap 110. Lowering the pedestal 119 relative to the top plate 108 increases the size of gap 110. In other embodiments, control system 114 can control a motor coupled to the top plate 108, a mechanism coupled to the top plate 108 or the pedestal 119 and cause the motor to move the top plate 108, a mechanism coupled to the top plate 108 or the pedestal 119 in a lateral direction as described above.

In one embodiment, the control system 114 stores reference data. The reference data can include sensor signals that are known to correspond to particular size of the gaps 110, a lifetime of a component(s) of the thin-film deposition system 100, characteristic(s) of a thin-film deposited by the thin-film deposition system 100 or characteristic(s) of a process material that flows into the thin-film deposition system 100. When the control system 114 receives sensor signals from the gap 110 sensor 113 and one or more of the counter 101, process material sensor 103 or thin-film sensor 112 as described above, the control system 114 compares the sensor signals to the reference data. Based on this comparison of the reference data to the respective sensor signals, the control system 114 causes the motor(s) to adjust the relative location of the top plate 108 with respect to the location of the wafer 110, e.g., adjusting the size of the gap 110. If comparison of the sensor signals to the reference data indicates that the sensor signals correspond to a gap 110 that is too large, the control system 114 causes the motor(s) to make the gap 110 smaller, e.g., lower the top plate 108 or raise the wafer 104. If comparison of the sensor signals to the reference data indicates that the sensor signals correspond to a gap 110 that is too small, the control system 114 causes the motor(s) to make the gap 110 larger, e.g., raise the top plate 108 or lower the wafer 104 and increase the gap 110.

In one example, the deposition recipe calls for a gap 110 of about 0.35 mm. The reference data stored by the control system 114 indicates that a gap 110 of 0.35 mm corresponds to sensor signals having a voltage or indicating a voltage of about 3.6 V. If the gap 110 is too small, the sensor signals may have a voltage or indicated voltage of about 3.5 V. The control system 114 adjusts the gap by raising the top plate 108 during the thin-film deposition process until the sensor signals have a voltage or indicate a voltage of about 3.6 V. If the gap 110 is too large, then the sensor signals may have a voltage or indicate a voltage of about 3.7 V. The control system 114 lowers the top plate 108 until the sensor signals have a voltage or indicated voltage of about 3.6 V. The voltages and distances given above are given only by way of example. Other distances, voltages, and types of sensor signals can be utilized without departing from the scope of the present disclosure.

The thin-film deposition system 100 can adjust the gap 110 in situ during a thin-film deposition process. For example, during the thin-film deposition process, the gap sensor 113 may continuously generate sensor signals indicative of the gap 110. One or more of the counter 101, process material sensor 103 and thin-film sensor 112 will continuously generate sensor signals indicative of lifetime of a component of the thin-film deposition system, a characteristic of a process material that flows into the thin-film deposition system or a characteristic of a thin-film deposited by the thin-film deposition system. The sensor signals may initially indicate that the gap 110 has the desired value. However, as the deposition process continues, a comparison of sensor signals from the other sensors may indicate that the gap 110 no longer has the desired value. The gap 110 no longer having the desired value could be the result of a number of factors. For example, the top plate 108 may be heated and expand due to thermal expansion, thereby decreasing the gap 110. The sensor signals from the gap sensor 113 would indicate this change in the gap 110 during the thin-film deposition process. The control system 114 can adjust the gap 110 by moving the top plate 108 or wafer 104. Thus, not only can the thin-film deposition system 100 adjust the gap 110, but the thin-film deposition system 100 can adjust the gap 110 in real time during thin-film deposition processes responsive to changing conditions during the thin-film deposition processes.

Figure 3:
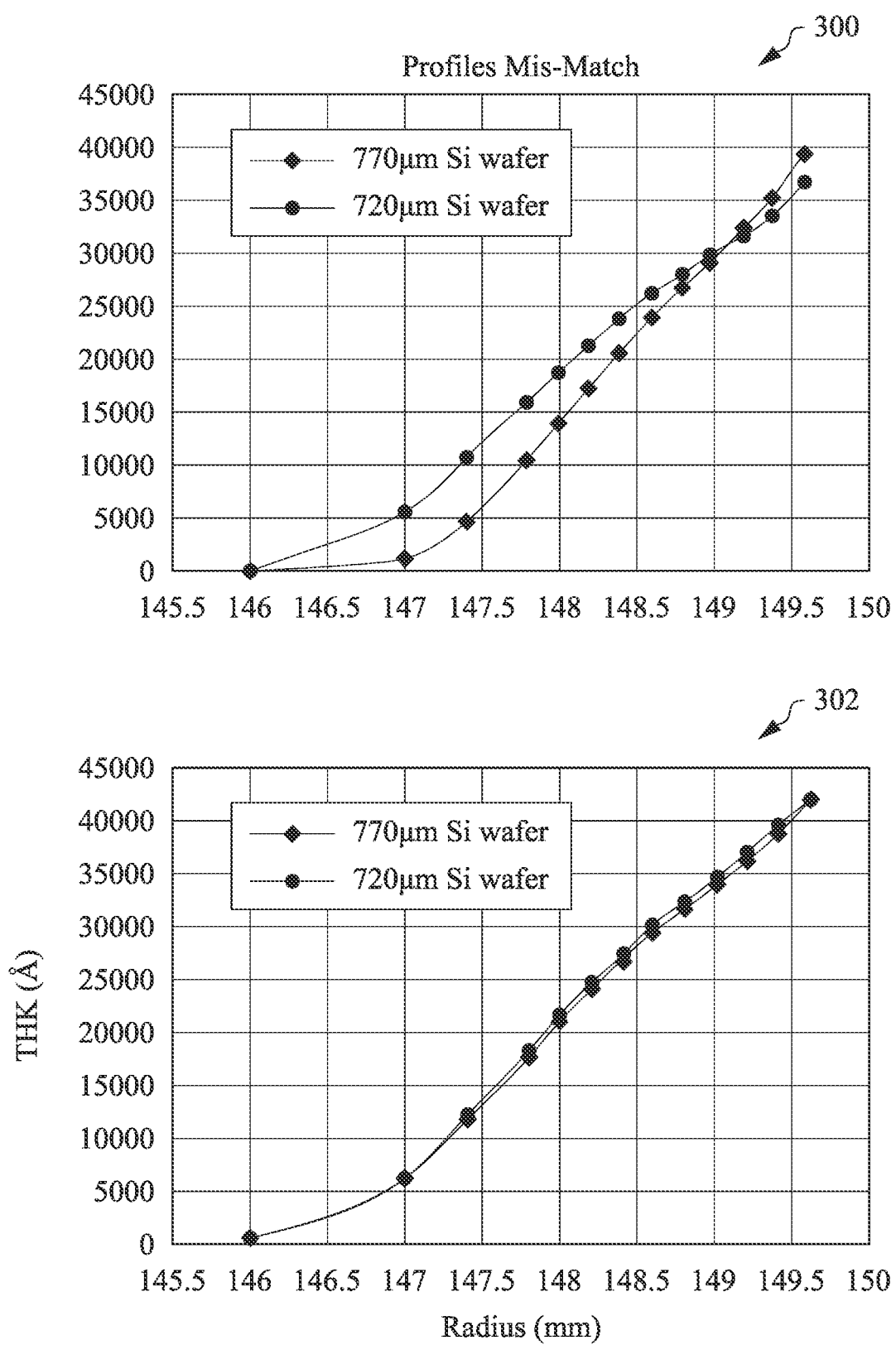
FIG. 3 includes graphs of thin-film deposition rates of two different wafers, according to one embodiment.

FIG. 3 includes graphs 300 and 302 indicating thin-film deposition rates for two types of wafers, according to one embodiment. The graph 300 illustrates that the deposition rate is different for wafers of thickness 720 μm than for wafers of thickness 770 μm in the absence of in situ gap adjustment as described in relation to FIGS. 1 and 2. For wafers of various radii, the 770 μm wafers have different deposition rates than the 720 μm thick wafers. This is because the gap 110 is different for these wafers based on their different thicknesses. The different deposition rates result in the 720 µm thick wafers having a thin-film thickness profile in the radial direction that is different from, i.e., not uniform with, the thickness profile in the radial direction of the thin-film on the wafers of thickness 770 µm.

The graph 302 illustrates a situation in which in situ gap control is performed as described in relation to FIGS. 1 and 2. In this case, the wafers of thickness 770 µm have the same deposition rate as the wafers of thickness 720 µm. This is because the gap sensor 113, the control system 114 and one or more of the other sensors 101, 103 and 112 cooperate to monitor the thin-film process and adjust the gap 110 in real time as described in relation to FIGS. 1 and 2. Thus, the two types of wafers have the same gap 110 and the same deposition rate which results in the two wafers having a uniform thickness profile in the radial direction.

Figure 4A:
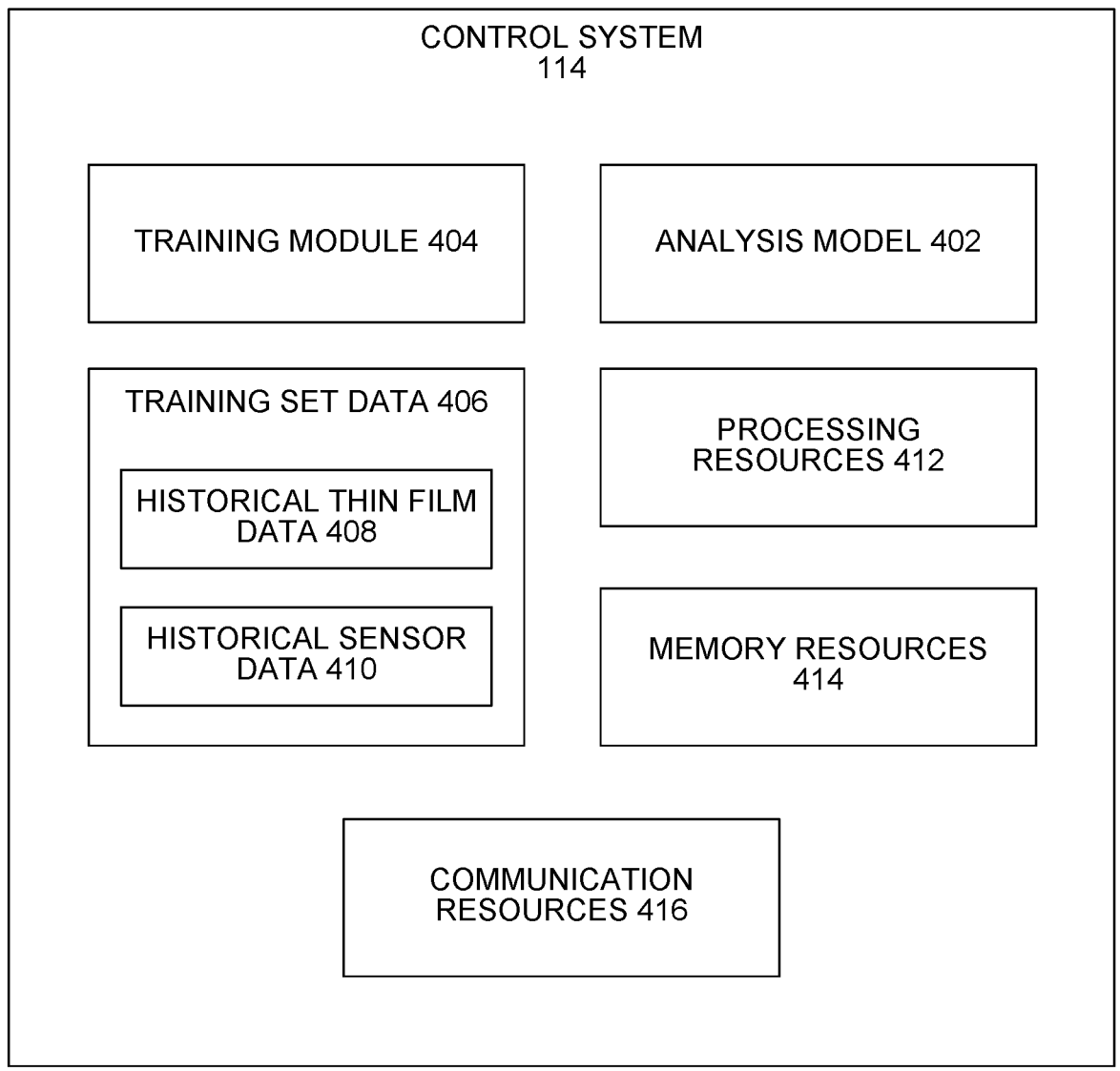
FIG. 4A is a block diagram of a control system, according to one embodiment.

FIG. 4A is a block diagram of the control system 114 of FIGS. 1 and 2, according to one embodiment. The control system 114 of FIG. 4A is configured to control operation of the thin-film deposition system 100 in depositing a thin-film on the wafer 104 and adjusting the gap 110, according to one embodiment. In another embodiment, control system 114 controls the flow rate of process materials through top plate 108. The control system 114 utilizes machine learning to learn to properly adjust the gap 110 responsive to the sensor signals received from the gap sensor 113 and one or more of the counter 101, process material sensor 103 and thin-film sensor 112. The control system 114 can adjust the gap 110 in situ during a thin-film deposition process. The control system 114 can also adjust the flow rate of process materials through top plate 108 during a thin-film deposition process.

In one embodiment, the control system 114 includes an analysis model 402 and a training module 404. The training module 404 trains the analysis model 402 with a machine learning process. The machine learning process trains the analysis model 402 to adjust the gap 110 to result in a thin-film having selected characteristics. Although the training module 404 is shown as being separate from the analysis model 402, in practice, the training module 404 may be part of the analysis model 402.

The control system 114 includes, or stores, training set data 406. The training set data 406 includes historical thin-film data 408 and historical sensor data 410. The historical thin-film data 408 includes data related to thin-films resulting from thin-film deposition processes. The historical sensor data 410 includes data related to sensor signals during the thin-film deposition processes that generated the thin-films. As will be set forth in more detail below, the training module 404 utilizes the historical thin-film data 408 and the historical sensor data 410 to train the analysis model 402 with a machine learning process.

In one embodiment, the historical thin-film data 408 includes data related to the thickness and composition of historically deposited thin-films. For example, during operation of a semiconductor fabrication facility, thousands or millions of semiconductor wafers may be processed over the course of several months or years. Each of the semiconductor wafers may include thin-films deposited by thin-film deposition processes. After each thin-film deposition process, the thicknesses of the thin-films are measured as part of a quality control process. The historical thin-film data 408 includes the thicknesses of each of the thin-films deposited by thin-film deposition processes. The historical thin-film data 408 can include thicknesses of each of the thin-films deposited by the thin-film deposition processes at different zones of the wafer. For example, the thicknesses of the thin-film at zone 1 center region of wafer, zone 2 a ring-shaped area outside of zone 1, zone 3 a ring-shaped area outside of zone 2 and zone 4 a ring-shaped area outside of zone 3 extending to the outer periphery of the wafer. Accordingly, the historical thin-film data 408 can include thickness data for a large number of thin-films at different locations on the wafer deposited by thin-film deposition processes.

In one embodiment, the historical sensor data 410 include various sensor signals or sensor data generated by gap sensor 113 and one or more of counter 101, process material sensor 103 and thin-film sensor 112 during thin-film deposition processes that deposited the thin-films associated with the historical thin-film data 408. Accordingly, for each thin-film having data in the historical thin-film data 408, the historical sensor data 410 can include the sensor signals that were generated by the gap sensor 113 and one or more of counter 101, process material sensor 103 and thin-film sensor 112 during deposition of the thin-film. For example, the historical sensor data 410 can be voltages generated by the receiver 112b of thin-film sensor 112.

In one embodiment, the training set data 406 links the historical thin-film data 408 with the historical sensor data 410. In other words, the thin-film characteristics, e.g., thickness, material composition, crystal structure, hardness, thermal stability, surface roughness, band gap or residual stresses associated with a thin-film in the historical thin-film data 408 is linked to the sensor signals data associated with that deposition process. As will be set forth in more detail below, the labeled training set data can be utilized in a machine learning process to train the analysis model 402 to predict semiconductor sensor signals that will result in properly formed thin-films.

In one embodiment, the control system 114 includes processing resources 412, memory resources 414, and communication resources 416. The processing resources 412 can include one or more controllers or processors. The processing resources 412 are configured to execute software instructions, process data, make thin-film deposition control decisions, perform signal processing, read data from memory, write data to memory, and to perform other processing operations. The processing resources 412 can include physical processing resources located at a site or facility of the thin-film deposition system 100. The processing resources can include virtual processing resources 412 remote from the site of the thin-film deposition system 100 or a facility at which the thin-film deposition system 100 is located. The processing resources 412 can include cloud-based processing resources including processors and servers accessed via one or more cloud computing platforms.

In one embodiment, the memory resources 414 can include one or more computer readable memories. The memory resources 414 are configured to store software instructions associated with the function of the control system and its components, including, but not limited to, the analysis model 402. The memory resources 414 can store data associated with the function of the control system 114 and its components. The data can include the training set data 406, current sensor signals data, and any other data associated with the operation of the control system 114 or any of its components. The memory resources 414 can include physical memory resources located at the site or facility of the thin-film deposition system 100. The memory resources 414 can include virtual memory resources located remotely from the site or facility of the thin-film deposition system 100. The memory resources 414 can include cloud-based memory resources accessed via one or more cloud computing platforms.

In one embodiment, the communication resources 416 can include resources that enable the control system 114 to communicate with equipment associated with the thin-film deposition system 100. For example, the communication resources 416 can include wired and wireless communication resources that enable the control system 114 to receive the sensor signals and to control the radiofrequency power source 122, the gas source 124, the heater 116, the motor that raises, lowers or laterally moves the top plate 108 or the motor that raises, lowers or laterally moves the pedestal.

Figure 4B:
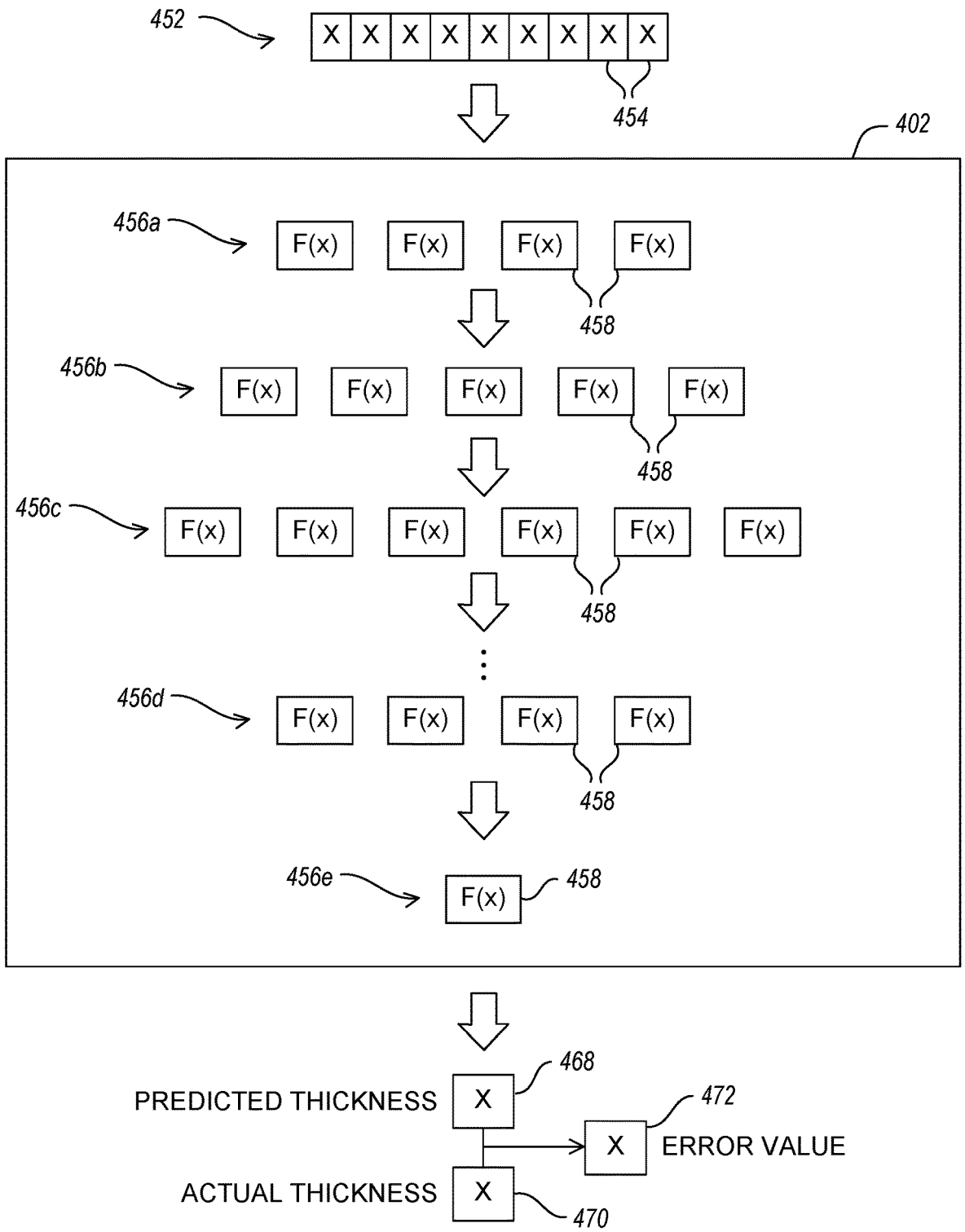
FIG. 4B is a block diagram of an analysis model of the control system of FIG. 4A, according to one embodiment.

FIG. 4B is a block diagram illustrating operational aspects and training aspects of the analysis model 402 of FIG. 4A, according to one embodiment. The analysis model 402 can be used to select adjustments to the gap 110 between the wafer 104 and the top plate 108 as described in relation to FIGS. 1 and 2. As described previously, the training set data 406 includes data related to a plurality of previously performed thin-film deposition processes. Each previously performed thin-film deposition process deposited a thin-film having a particular thickness and being associated with particular sensor signals based on the gap 110. The sensor signals for each previously performed thin-film deposition process are formatted into a respective sensor signals vector 452. The sensor signals vector 452 includes a plurality of data fields 454. Each data field 454 corresponds to a sensor signal at a particular time during the deposition process.

The analysis model 402 includes a plurality of neural layers 456a-e. Each neural layer includes a plurality of nodes 458. Each node 458 can also be called a neuron. Each node 458 from the first neural layer 456a receives the data values for each data field 454 from the sensor signals vector 452. Accordingly, in the example of FIG. 4B, each node 458 from the first neural layer 456a receives nine data values because the sensor signals vector 452 has nine data fields 454. Each node 458 includes a respective internal mathematical function labeled F(x) in FIG. 4B. Each node 458 of the first neural layer 456a generates a scalar value by applying the internal mathematical function F(x) to the data values from the data fields 454 of the sensor signals vector 452. Further details regarding the internal mathematical functions F(x) are provided below.

Each node 458 of the second neural layer 456b receives the scalar values generated by each node 458 of the first neural layer 456a. Accordingly, in the example of FIG. 4B, each node of the second neural layer 456b receives four scalar values because there are four nodes 458 in the first neural layer 456a. Each node 458 of the second neural layer 456b generates a scalar value by applying the respective internal mathematical function F(x) to the scalar values from the first neural layer 456a.

Each node 458 of the third neural layer 456c receives the scalar values generated by each node 458 of the second neural layer 456b. Accordingly, in the example of FIG. 4B, each node of the third neural layer 456c receives five scalar values because there are five nodes 458 in the second neural layer 456b. Each node 458 of the third neural layer 456c generates a scalar value by applying the respective internal mathematical function F(x) to the scalar values from the nodes 458 of the previous neural layer.

Each node 458 of the neural layer 456d receives the scalar values generated by each node 458 of the previous neural layer (not shown). Each node 458 of the neural layer 456d generates a scalar value by applying the respective internal mathematical function F(x) to the scalar values from the nodes 458 of the second neural layer 456b.

The final neural layer includes only a single node 458, for example. The final neural layer receives the scalar values generated by each node 458 of the previous neural layer 456d. The node 458 of the final neural layer 456e generates a data value 468 by applying a mathematical function F(x) to the scalar values received from the nodes 458 of the neural layer 456d.

In the example of FIG. 4B, the data value 468 corresponds to the predicted thickness of a thin-film generated by sensor signals data corresponding to values included in the sensor signals vector 452. In other embodiments, the final neural layer 456e may generate multiple data values each corresponding to a particular thin-film characteristic such as thin-film crystal orientation, thin-film uniformity, or other characteristics of a thin-film described above. The final neural layer 456e will include a respective node 458 for each output data value to be generated. In the case of a predicted thin-film thickness, engineers or users can provide constraints to specify that the predicted thin-film thickness 468 falls within a selected range, such as between 0 nm and 50 nm, in one example. The analysis model 402 will adjust internal functions F(x) to ensure that the data value 468 corresponding to the predicted thin-film thickness will fall within the specified range.

During the machine learning process, the analysis model 402 compares the predicted thickness in the data value 468 to the actual thickness of the thin-film as indicated by the data value 470. As set forth previously, the training set data 406 includes, for each set of historical sensor signals data, thin-film characteristics data indicating the characteristics of the thin-film that resulted from the historical thin-film deposition process. Accordingly, the data field 454 includes the actual thickness of the thin-film that resulted from the deposition process reflected in the sensor signals vector 452. The analysis model 402 compares the predicted thickness from the data value 468 to the actual thickness from the data value 470. The analysis model 402 generates an error value 472 indicating the error or difference between the predicted thickness from the data value 468 and the actual thickness from the data value 470. The error value 472 is utilized to train the analysis model 402.

The training of the analysis model 402 can be more fully understood by discussing the internal mathematical functions F(x). While all of the nodes 458 are labeled with an internal mathematical function F(x) in one embodiment, the mathematical function F(x) of each node is unique. In one example, each internal mathematical function has the following form:

$$F(x) = x_1 * w_1 + x_2 * w_2 + \ldots x_n * w_1 + b.$$

In the equation above, each value $x_1$-$x_n$ corresponds to a data value received from a node 458 in the previous neural layer, or, in the case of the first neural layer 456a, each value $x_1$-$x_n$ corresponds to a respective data value from the data fields 454 of the sensor signals vector 452. Accordingly, n for a given node is equal to the number of nodes in the previous neural layer. The values $w_1$-$w_n$ are scalar weighting values associated with a corresponding node from the previous layer. The analysis model 402 selects the values of the weighting values $w_1$-$w_n$. The constant b is a scalar biasing value and may also be multiplied by a weighting value. The value generated by a node 458 is based on the weighting values $w_1$-$w_n$. Accordingly, each node 458 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 472 has been calculated, the analysis model 402 adjusts the weighting values $w_1$-$w_n$ for the various nodes 458 of the various neural layers 456a-456e. After the analysis model 402 adjusts the weighting values $w_1$-$w_n$, the analysis model 402 again provides the sensor signals vector 452 to the input neural layer 456a. Because the weighting values are different for the various nodes 458 of the analysis model 402, the predicted thickness 468 will be different than in the previous iteration. The analysis model 402 again generates an error value 472 by comparing the actual thickness from the data value 470 to the predicted thickness from the data value 468.

The analysis model 402 again adjusts the weighting values $w_1$-$w_n$ associated with the various nodes 458. The analysis model 402 again processes the sensor signals vector 452 and generates a predicted thickness 468 and associated error value 472. The training process includes adjusting the weighting values $w_1$-$w_n$ in iterations until the error value 472 is minimized.

FIG. 4B illustrates a single sensor signals vector 452 being passed to the analysis model 402. In practice, the training process includes passing a large number of sensor signals vectors 452 through the analysis model 402, generating a predicted thickness 468 for each sensor signals vector 452, and generating associated error value 472 for each predicted thickness. The training process can also include generating an aggregated error value indicating the average error for all the predicted thicknesses for a batch of sensor signals vectors 452. The analysis model 402 adjusts the weighting values $w_1$-$w_n$ after processing each batch of sensor signals vectors 452. The training process continues until the average error across all sensor signals vectors 452 is less than a selected threshold tolerance in one embodiment. When the average error is less than the selected threshold tolerance, training of the analysis model 402 is complete and the analysis model 402 is trained to accurately predict the thickness of thin-films based on the sensor signals. The analysis model 402 can then be used to select sensor signal values that will result in a desired thin-film thickness. Thus, the analysis model 402 can receive current sensor signals, determine sensor signal values that will result in the desired thin-film thickness, and then adjust the gap 110 to adjust the sensor signals.

A particular example of a neural network based analysis model 402 has been described in relation to FIG. 4B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 5:
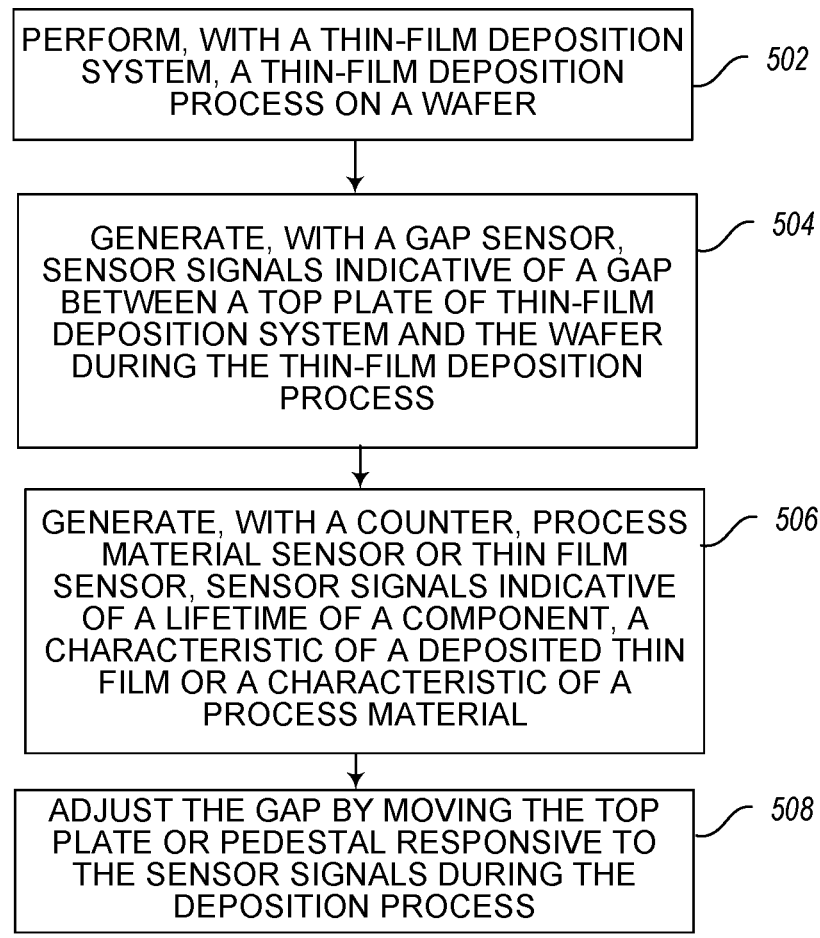
FIG. 5 is a flow diagram of a method for performing a thin-film deposition process, according to one embodiment.

FIG. 5 is a flow diagram of a method 500 for performing a thin-film deposition process. The method 500 can be performed in relation to the systems, components, and processes described in relation to FIGS. 1-4B. At 502, the method 500 includes performing, with a thin-film deposition system, a thin-film deposition process on a wafer. One example of a thin-film deposition system is the thin-film deposition system 100 of FIG. 1. At 504, the method 500 includes generating, with a gap sensor, sensor signals indicative of a gap between a top plate of thin-film deposition system and the wafer during the thin-film deposition process. One example of a gap sensor is the gap sensor 113 of FIG. 1. One example of a top plate is the top plate 108 of FIG. 1. One example of a wafer is the wafer 104 of FIG. 1. One example of a gap is the gap 110 of FIG. 1. At 506, the method 500 includes generating, with a counter, a process material sensor or a thin-film sensor, sensor signals indicative of a lifetime of a component of a thin-film deposition system, a characteristic of a thin-film formed by the thin-film deposition system or a characteristic of a process material provided to the thin-film deposition system. One example of a counter is counter 101 of FIGS. 1 and 2. One example of a process material sensor is process material sensor 103 of FIG. 2. One example of a thin-film sensor is thin-film sensor 112 of FIG. 1. At 508, the method 500 includes adjusting the gap by moving a top plate or a pedestal responsive to the sensor signals during the thin-film deposition process. One example of a top plate is top plate 108 in FIG. 1. One example of a pedestal is pedestal 119 in FIG. 2.

Figure 6:
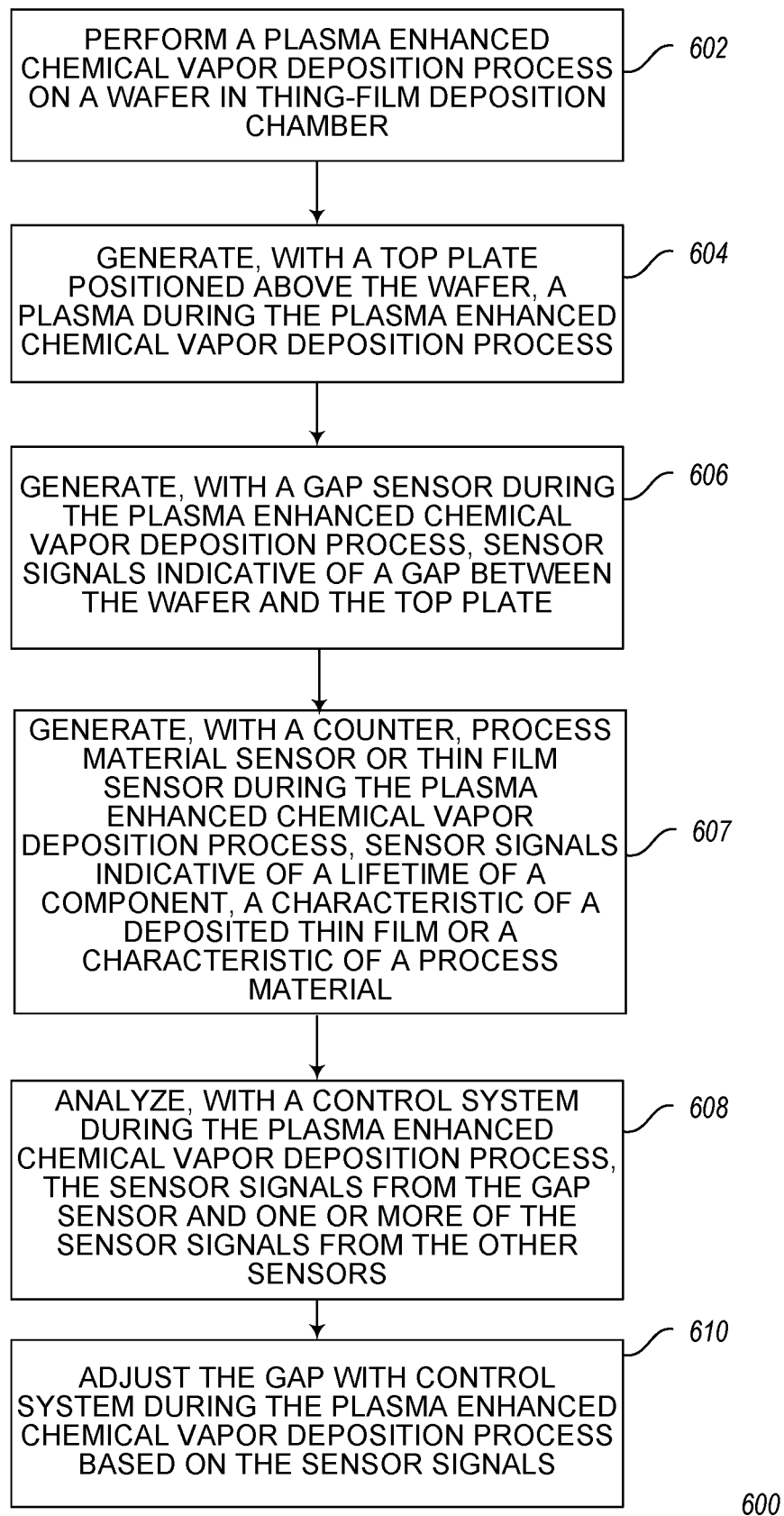
FIG. 6 is a flow diagram of a method for performing a thin-film deposition process, according to one embodiment.

FIG. 6 is a flow diagram of a method 600 for performing a thin-film deposition process. The method 600 can be performed in relation to the systems, components, and processes described in relation to FIGS. 1-5. At 602, the method 600 includes performing a plasma enhanced chemical vapor deposition process on a wafer in a thin-film deposition chamber. One example of a thin-film deposition chamber is the thin-film deposition chamber 102 of FIG. 2. One example of a wafer is the wafer 104 of FIG. 2. At 604, the method 600 includes generating, with a top plate positioned above the wafer, a plasma during the plasma enhanced chemical vapor deposition process. One example of a top plate is the top plate 108 of FIG. 2. At 606, the method 600 includes generating, with a gap sensor during the plasma enhanced chemical vapor deposition process, sensor signals indicative of a gap between the wafer and the top plate. One example of a gap sensor is the gap sensor 113 of FIG. 2. One example of a gap is the gap 110 of FIG. 2. At 607, the method includes generating, with a counter, a process material sensor or a thin-film sensor during the plasma enhance chemical vapor deposition process, sensor signals indicative of a lifetime of a component of the thin-film deposition system, a characteristic of a thin-film deposited by the thin-film deposition system or a characteristic of a process material delivered to the thin-film deposition system. One example of a counter is counter 101 of FIG. 1. One example of a process material sensor is process material sensor 103 of FIG. 2. One example of a thin-film sensor is gap sensor 112 of FIG. 1. At 608, the method 600 includes analyzing, with a control system during the plasma enhanced chemical vapor deposition process, the sensor signals from the gap sensor and one or more sensor signals from the counter, process material sensor or thin-film sensor. One example of a control system is the control system 114 of FIG. 2. At 610, the method 600 includes adjusting the gap with the control system during the plasma enhanced chemical vapor deposition process based on the sensor signals.

In one embodiment, method 600 is implemented using sensor signals indicative of the uniformity of the thin-film at various zones of the wafer (from thin-film sensor 112), the process gas flow rate into the deposition chamber (from process material sensor 103) and gap size (from gap sensor 113). In another embodiment, method 600 is implemented using sensor signals indicative of the uniformity of the thin-film at different zones of the wafer (from thin-film sensor 112), the process gas composition (from process material sensor 103) and gap size (from gap sensor 113). In another embodiment, method 600 is implemented using sensor signals indicative of the uniformity of the thin-film at different zones of the wafer (from thin-film sensor 112), the process gas pressure (from process material sensor 103) and gap size (from gap sensor 113). In another embodiment, method 600 is implemented using sensor signals indicative of the uniformity of the thin-film at different zones of the wafer (from thin-film sensor 112), the process gas temperature (from process material sensor 103) and gap size (from gap sensor 113). In another embodiment, sensor signals indicative of a wafer tilt angle from a tilt angle sensor associated with the pedestal 119 or wafer support 118 and combined with the sensor signals of the embodiments are described above in carrying out method 600.

In one embodiment, method 600 is implemented using sensor signals indicative of one or more of the thickness of the thin-film, film composition, film crystal structure, a hardness of the thin-film, thermal stability of the thin-film, surface roughness of the thin-film, band gap of the thin-film and residual stresses in the thin-film at various zones of the wafer (from thin-film sensor 112), the process gas flow rate into the deposition chamber (from process material sensor 103) and gap size (from gap sensor 113). In another embodiment, method 600 is implemented using sensor signals indicative of one or more of the thickness of the thin-film, film composition, film crystal structure, a hardness of the thin-film, thermal stability of the thin-film, surface roughness of the thin-film, band gap of the thin-film or residual stresses in the thin-film at different zones of the wafer (from thin-film sensor 112), the process gas composition (from process material sensor 103) and gap size (from gap sensor 113). In another embodiment, method 600 is implemented using sensor signals indicative of the thickness of the thin-film, film composition, film crystal structure, a hardness of the thin-film, thermal stability of the thin-film, surface roughness of the thin-film, band gap of the thin-film or residual stresses in the thin-film at different zones of the wafer (from thin-film sensor 112), the process gas pressure (from process material sensor 103) and gap size (from gap sensor 113). In another embodiment, method 600 is implemented using sensor signals indicative of the one or more of the thickness of the thin-film, film composition, film crystal structure, a hardness of the thin-film, thermal stability of the thin-film, surface roughness of the thin-film, band gap of the thin-film or residual stresses in the thin-film at different zones of the wafer (from thin-film sensor 112), the process gas temperature (from process material sensor 103) and gap size (from gap sensor 113). In another embodiment, sensor signals indicative of wafer tilt angle from a tilt angle sensor associated with the pedestal 119 or wafer support 118 and combined with the sensor signals of the embodiments are described above in carrying out method 600.

In other embodiments of carrying out method 600, sensor signals indicative of gap size (from gap sensor 113) are not utilized.

In one embodiment, method 600 is implemented using sensor signals indicative of one or more of the thickness of the thin-film on the wafer, film composition on the wafer, film crystal structure on the wafer, a hardness of the thin-film on the wafer, thermal stability of the thin-film on the wafer, surface roughness of the thin-film on the wafer, band gap of the thin-film on the wafer and residual stresses in the thin-film on the wafer at one or more zones of the wafer (from thin-film sensor 112), and one or more of the following: the lifetime of the showerhead (from counter 101 or timer), length of time process chamber has been operated since start of the current run or since the last periodic maintenance (from counter 101 or a timer), the run to run variation in the accumulation of deposited material on walls of the process chamber (from a thin-film sensor) and flow rate of process gas into the chamber (from process material sensor 103). The inventors have observed that adjusting the distance D of gap 110 based on consideration of a combination of the specific sensor signals described in this paragraph is particularly effective at producing thin films on wafers that are of desirable uniformity.

In one embodiment, a method includes performing, with a thin-film deposition system, a thin-film deposition process on a wafer, generating, with a sensor, sensor signals indicative of a lifetime of a component of the thin-film deposition system, characteristics of a thin-film deposited by the thin-film deposition system or a characteristic of a process material that flows into the thin-film deposition system during the thin-film deposition process. The method further includes a step of adjusting a relative location of a top plate of the thin-film deposition system with respect to a location of a wafer in the thin-film deposition system in response to the sensor signals during the thin-film deposition process.

In one embodiment, a thin-film deposition system includes a thin-film deposition chamber, a wafer support positioned in the thin-film deposition chamber and configured to support a wafer in the thin-film deposition chamber, and a top plate positioned above the wafer support and configured to generate a plasma in the thin-film deposition chamber during a thin-film deposition process. The system includes a sensor configured to generate sensor signals indicative of a lifetime of a component of the thin-film deposition system, a characteristic of a thin-film deposited by the thin-film deposition system or a characteristic of a process material that flows into the thin-film deposition system during a thin-film deposition process. The system also includes a control system configured to receive the sensor signals and to adjust a relative location of a top plate of the thin-film deposition system with respect to a location of a wafer in the thin-film deposition system responsive to the sensor signals.

In one embodiment, a method includes performing a plasma enhanced chemical vapor deposition process on a wafer in a thin-film deposition chamber. The method includes generating, with a top plate positioned above the wafer, a plasma during the plasma enhanced chemical vapor deposition process, and generating, with a sensor during the plasma enhanced chemical vapor deposition process, sensor signals indicative of a lifetime of a component of the thin-film deposition system, a characteristic of a thin-film deposited by the thin-film deposition system or a characteristic of a process material that flows into the thin-film deposition system. The method further includes a step of analyzing, with a control system during the plasma enhanced chemical vapor deposition process, the sensor signals. The location of a top plate of the thin-film deposition system relative to a location of a wafer in the thin-film deposition system is adjusted by the control system during the plasma enhanced chemical vapor deposition process based on the sensor signals.

Embodiments of the present disclosure provide a thin-film deposition system with improved performance. A thin-film deposition system includes a top plate positioned above a wafer. Embodiments of the present disclosure monitor the gap between the top plate and the wafer and automatically adjust the gap in situ during a deposition process. This provides for steady deposition rates and produces more uniform thin-films on a given wafer and from wafer to wafer. The result is that fewer wafers are scrapped, equipment is replaced less frequently, and thin-films are properly formed.

The various embodiments described above can be combined to provide further embodiments. Aspects of the embodiments can be modified, as needed, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
performing, with a thin-film deposition system, a thin-film deposition process on a wafer;
generating, with a top plate positioned above the wafer, a plasma during the thin film deposition process;
generating, with a first sensor, a first sensor signal indicative of a lifetime of a component of the thin-film deposition system or a characteristic of a thin-film deposited by the thin-film deposition system;
generating, with a through beam laser sensor during the thin-film deposition process, a second sensor signal indicative of a distance D between a bottom surface of the top plate and a top surface of the wafer, the generating the second sensor signal indicative of the distance D between the bottom surface of the top plate and the top surface of the wafer including emitting a radiation beam from a radiation emitter, the radiation beam emitted from the radiation emitter having a diameter greater than the distance D between a top surface of the wafer and a bottom surface of the top plate, passing a portion of the radiation beam between the bottom surface of the top plate and the top surface of the wafer and receiving at a radiation sensor the portion of the radiation beam emitted from the radiation emitter that has passed between the bottom surface of the top plate and the top surface of the wafer; and
adjusting a relative location of a top plate of the thin-film deposition system with respect to a location of the wafer in the thin-film deposition system in response to the second sensor signal during the thin-film deposition process.

2. The method of claim 1, wherein the first sensor is a counter configured to generate a first sensor signal indicative of a number of wafers processed by the thin-film deposition system.

3. The method of claim 1, wherein the first sensor is configured to generate a first sensor signal indicative of a thickness of the thin-film deposited by the thin-film deposition system on the wafer or on a surface of a chamber in which the thin-film deposition process on the wafer is performed.

4. The method of claim 3, wherein the first sensor is configured to generate a first sensor signal indicative of a zone of the wafer from which the first signal indicative of the thickness of the thin-film deposited by the thin-film deposition system on the wafer is generated.

5. The method of claim 1, further comprising:
training an analysis model of a control system with a machine learning process;
analyzing the second sensor signal with the analysis model;
determining, with the analysis model, an adjustment to be made to the distance D between the bottom surface of the top plate and the top surface of the wafer based on the analyzed second sensor signal; and
adjusting the relative location of the top plate of the thin-film deposition system with respect to the location of the wafer in the thin-film deposition system with the control system based on the analysis model.

6. The method of claim 1, wherein the adjusting includes adjusting a distance between the top plate and the wafer.

7. The method of claim 6, wherein the adjusting includes moving the top plate.

8. The method of claim 6, wherein the adjusting includes moving the wafer.

9. The method of claim 8, further comprising:
passing the second sensor signal to a control system;
determining, with the control system, an adjustment to be made to the distance D between the bottom surface of the top plate and the top surface of the wafer based on the second sensor signal; and
adjusting the distance D by moving the top plate, moving the wafer or moving both in accordance with the determined adjustment.

10. The method of claim 1, wherein the generating, with the through beam laser sensor during the thin film deposition process, the second sensor signal indicative of a distance D between the bottom surface of the top plate and the top surface of the wafer includes blocking a portion of the radiation beam by a side of the top plate and a side of the wafer.

11. The method of claim 1, wherein the adjusting the relative location of the top plate of the thin-film deposition system with respect to the location of the wafer includes moving the wafer in a lateral direction relative to the top plate.

12. A method, comprising:
performing a plasma enhanced chemical vapor deposition process on a wafer in a thin-film deposition chamber;
generating, with a top plate positioned above the wafer, a plasma during the plasma enhanced chemical vapor deposition process;
generating, with a through beam laser sensor during the plasma enhanced chemical vapor deposition process, a second sensor signal indicative of a distance D between a bottom surface of the top plate and a top surface of the wafer, the generating the seconda sensor signal indicative of the distance D between the bottom surface of the top plate and the top surface of the wafer including emitting a radiation beam from a radiation emitter, blocking a portion of the radiation beam with the top plate and with the wafer, passing a portion of the radiation beam not blocked by the top plate and the wafer between the bottom surface of the top plate and the top surface of the wafer and receiving at a radiation sensor the portion of the radiation passing between the bottom surface of the top plate and the top surface of the wafer, the radiation beam emitted from the radiation emitter having a diameter greater than the distance D between the top surface of the wafer and the bottom surface of the top plate;
analyzing, with a control system during the plasma enhanced chemical vapor deposition process, the second sensor signal; and
adjusting a location of the top plate of the thin-film deposition system relative to a location of the wafer in the thin-film deposition system with the control system during the plasma enhanced chemical vapor deposition process based on the second sensor signal.

13. The method of claim 12, wherein analyzing the second sensor signal includes comparing the second sensor signal to reference data.

14. The method of claim 12, further comprising:
training an analysis model of the control system with a machine learning process;
analyzing the second sensor signal with the analysis model;
determining, with the analysis model, an adjustment to be made to a gap the distance D between bottom surface of the top plate and the top surface of the wafer based on the second sensor signal; and
adjusting the relative location of the top plate of the thin-film deposition system with respect to the location of the wafer in the thin-film deposition system with the control system based on the analysis model.

15. A method, comprising:
performing a plasma enhanced chemical vapor deposition process on a wafer in a deposition chamber;
generating, with a top plate positioned above the wafer, a plasma during the plasma enhanced chemical vapor deposition process;
generating, with a first sensor during the plasma enhanced chemical vapor deposition process, a first sensor signal indicative of a lifetime of a component of the thin-film deposition system, a characteristic of a thin-film deposited by a thin-film deposition system or a characteristic of a process material that flows into the thin-film deposition system;
generating, with a through beam laser sensor during the plasma enhanced chemical vapor deposition process, a second sensor signal indicative of a distance D between a bottom surface of the top plate and a top surface of the wafer, the generating the second sensor signal indicative of the distance D between the bottom surface of the top plate and the top surface of the wafer including emitting a radiation beam from a radiation emitter, passing a portion of the radiation beam between the bottom surface of the top plate and the top surface of the wafer and receiving at a radiation sensor the portion of the radiation beam passed between the bottom surface of the top plate and the top surface of the wafer, the radiation beam emitted from the radiation emitter having a diameter greater than the distance D between a top surface of the wafer and a bottom surface of the top plate;
analyzing, with a control system during the plasma enhanced chemical vapor deposition process, the first sensor signal and the second sensor signal indicative of the distance D; and
adjusting a location of the top plate of the thin-film deposition system relative to a location of the wafer in the thin-film deposition system with the control system during the plasma enhanced chemical vapor deposition process based on the first sensor signal and the second sensor signal indicative of the distance D.

16. The method of claim 15, wherein the generating, with the through beam sensor during the plasma enhanced chemical vapor deposition process, the second sensor signal indicative of the distance D between the bottom surface of the top plate and the top surface of the wafer includes blocking a portion of the radiation beam by a side of the top plate and a side of the wafer.

17. The method of claim 15, adjusting a location of the top plate of the thin-film deposition system relative to a location of the wafer includes moving the top plate laterally or moving the wafer laterally.

18. The method of claim 15, wherein the first sensor signal is indicative of a thickness of the thin-film deposited by the thin-film deposition system on the wafer or on a surface of a chamber in which the thin-film deposition process on the wafer is performed.

19. The method of claim 15, wherein the first sensor signal is indicative of the thickness of the thin-film deposited by the thin-film deposition system on a specific zone of the wafer.

20. The method of claim 12, wherein the adjusting includes moving both the top plate and the wafer.

* * * * *